United States Patent [19]

Beinhaur et al.

[11] Patent Number: 5,198,279
[45] Date of Patent: Mar. 30, 1993

[54] CIRCUIT BOARD STIFFENER

[75] Inventors: Ernest L. Beinhaur; Daniel T. Casey, both of Harrisburg, Pa.

[73] Assignee: AMP Incorporated, Harrisburg, Pa.

[21] Appl. No.: 662,541

[22] Filed: Feb. 28, 1991

[51] Int. Cl.⁵ .................. B32B 3/06; H01R 13/66
[52] U.S. Cl. ........................... 428/99; 428/120;
428/131; 428/156; 428/167; 428/212; 428/901;
174/138 G; 174/250; 269/903; 361/331;
361/392; 361/395; 361/415; 439/620
[58] Field of Search ............... 428/156, 167, 172, 901,
428/77, 78, 99, 120, 131, 188, 192, 212, 542.8,
913; 269/903; 174/250, 255, 97, 138 G;
361/392-395, 331, 415; 439/620

[56] References Cited

U.S. PATENT DOCUMENTS 3,369,821  2/1968  Weber ............................ 428/167
4,835,034  5/1989  Cruz ............................... 428/167

Primary Examiner—Donald J. Loney
Attorney, Agent, or Firm—Anton P. Ness

[57] ABSTRACT

A board stiffener (50) of rigid construction of high heat resistance material having recesses (62) to be secured to a large circuit board (10) over a plurality of electrical articles having contacts (24) soldered to the board, such as electrical connectors (20). The board stiffener (50) is mounted firmly to the board at locations near each recess (62) in abutment with top surfaces (34) of connectors (20) and provides resistance against warping by the board (10) during high temperature soldering operations. The board stiffener (50) can have channels (68,70) along the bottom surface (52) and the recess surfaces (72,74) to enable flow of solvent during flux cleaning following soldering operations.

5 Claims, 3 Drawing Sheets

CIRCUIT BOARD STIFFENER

FIELD OF THE INVENTION

The present invention relates to the field of circuit boards such as printed circuit boards, and more particularly to devices mountable to circuit boards.

BACKGROUND OF THE INVENTION

Circuit boards of a large size can have mounted thereto a plurality of electrical components such as electrical connectors to provide a plurality of electrical connections with circuit paths of the circuit boards, and the components and connectors can include a plurality of electrical contacts to establish the electrical connections. In certain situations a plurality of like electrical connectors are to be mounted to the board in an array in which the connectors are spaced distances apart and have an array of contacts for electrical connection to the board such as by having pin sections extending into through-holes of the board within which they are then soldered. Conventional soldering methods entail subjecting the board and components and connectors being soldered thereto to high temperatures such as in the range of 450°-500° F. Large sized boards are known to warp to some extent as a result of such high temperatures which is undesirable and can reduce the assurance of proper electrical connections between the contacts and the circuits of the board; warping can also interfere with placement of a plurality of such circuit boards in closely spaced arrays such as in a card cage, and can even result in short circuiting between boards.

SUMMARY OF THE INVENTION

The present invention is a member mountable to a circuit board spanning several sites of electrical connectors, which is rigid and precisely rectilinear along a board-proximate surface and when fastened to the board can minimize warping of the board during the vapor phase soldering operations. The member is preferably molded of especially heat resistant material to define a rigid dimensionally stable member, and thereby the integrity of its molded shape and dimensions is maintained to stiffen the adjacent board against warping when secured to the board at a plurality of sites along its length.

The stiffening member is adapted for connectors to be mounted therealong at selected precise positions for their contact arrays to be associated with corresponding arrays of circuit terminus locations of the board for electrical connection therewith. Precisely shaped and dimensioned recesses along a side surface or bottom surface of the stiffening member receive respective connector housings thereinto, such as by interference fit.

The bottom surface of the stiffening member is held firmly in close or abutting relationship with the board surface and also may preferably include a plurality of channels therealong for the flow of cleaning solvent used in the vapor phase or wave soldering operation to clean excess flux from the board following soldering to define the solder joints at the electrical connections of the connector contacts with the circuit termini. A secondary benefit is to permit a level of air flow adjacent the board surface and contacts during inservice use of the board to dissipate heat generated by the board and its components and connectors.

An example of an embodiment of the present invention will now be described with reference to the accompanying drawings.

DETAILED DESCRIPTION OF THE PREFERRED EMBODIMENT

Figure 1:
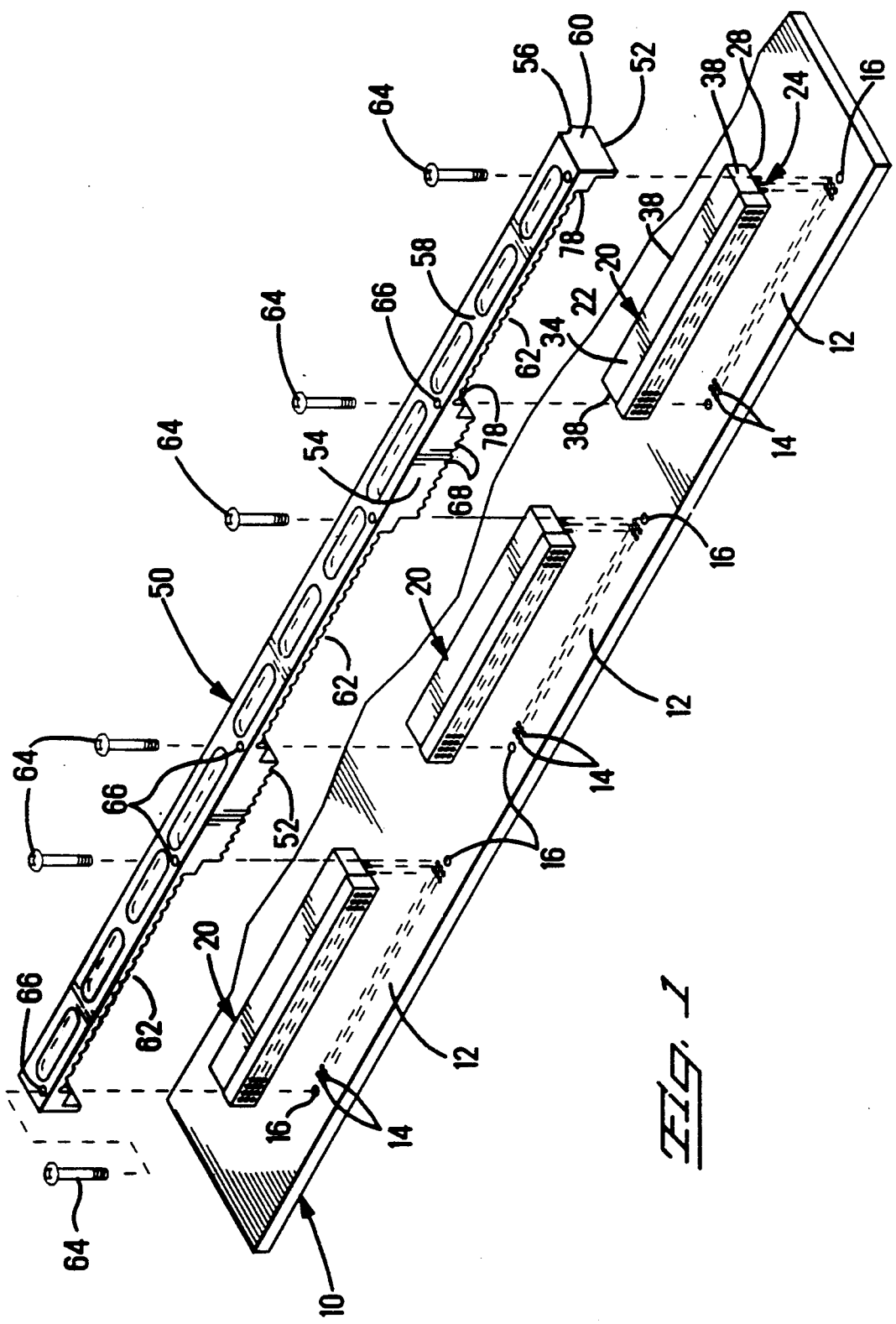
FIG. 1 is an isometric view of a segment of a large circuit board having three circuit termini arrays, from which are exploded respective multicontact connectors above which is superposed a board stiffener of the present invention.
Figure 2:
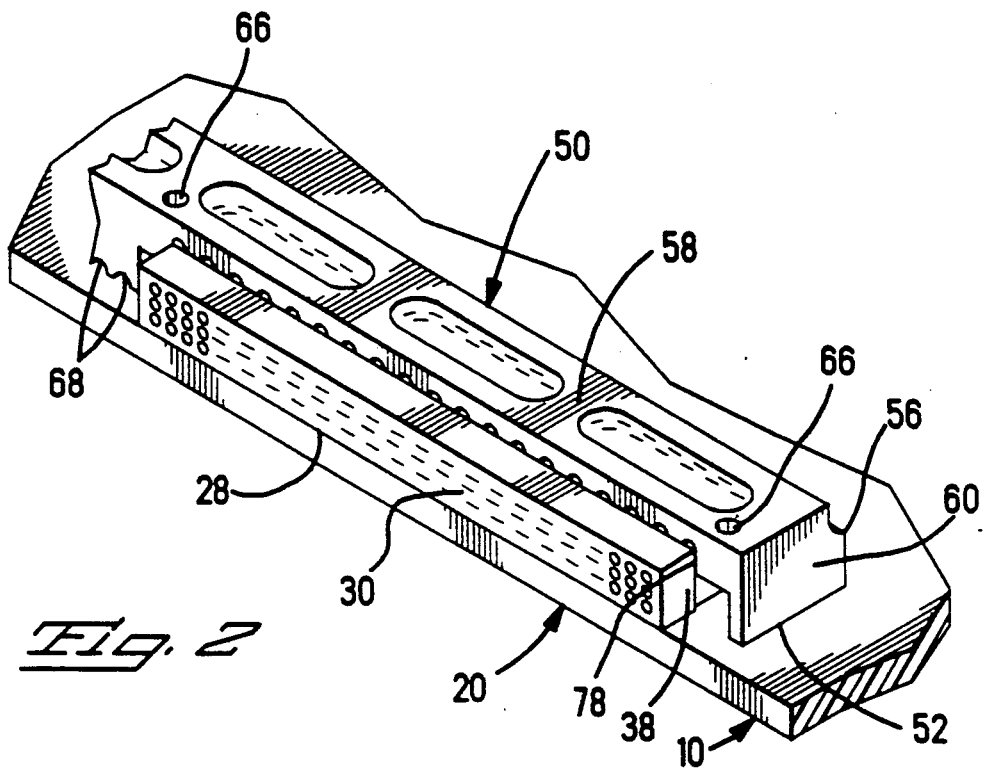
FIG. 2 is an enlarged isometric view of an assembly of a connector to the circuit board, with the board stiffener mounted in position against the board and about the connector.
Figure 3:
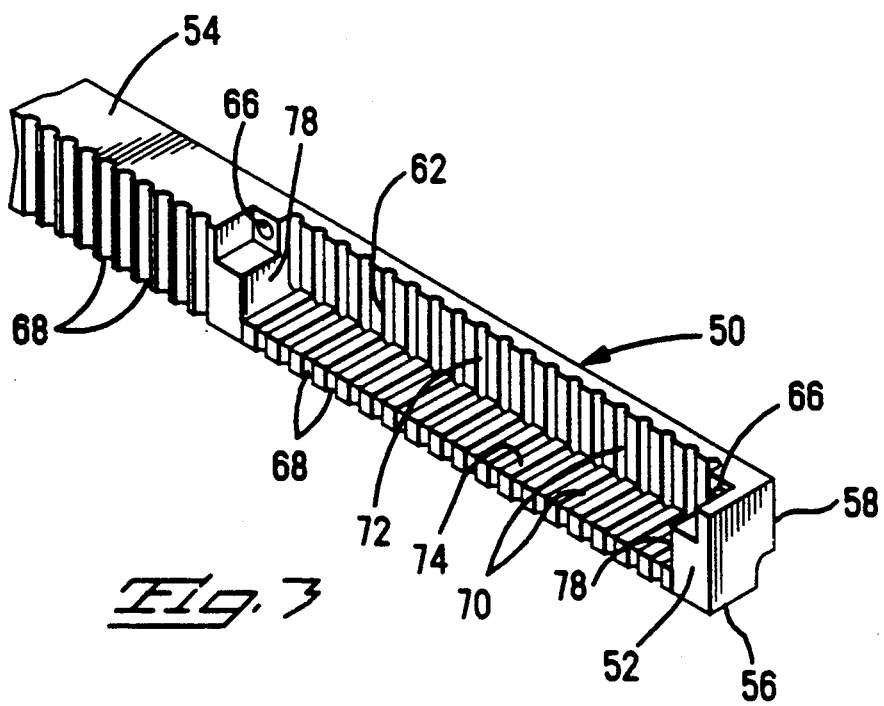
FIG. 3 is an enlarged isometric view of the board stiffener of FIGS. 1 and 2 rotated 90° onto its side, at a connector location to expose the bottom surface.
Figure 4:
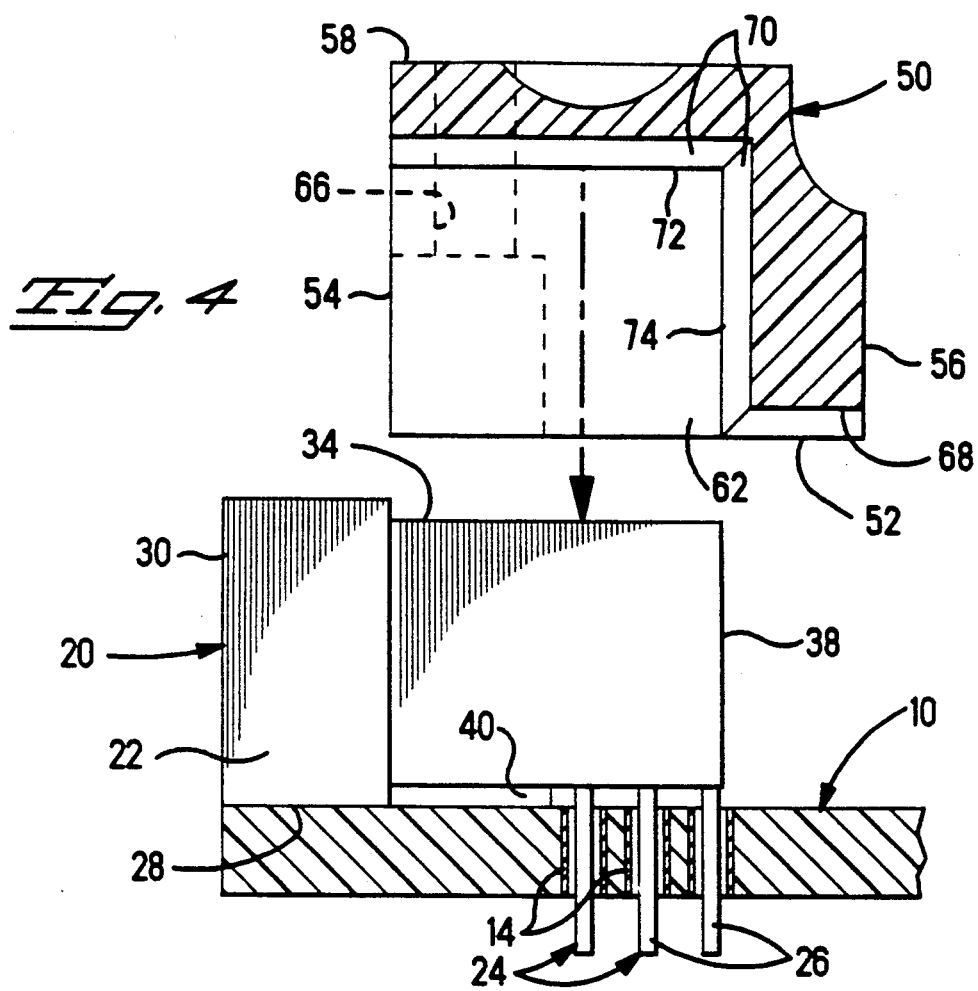
FIGS. 4 and 5 are cross-sectional views showing the board stiffener being assembled to the board about a connector.
Figure 5:
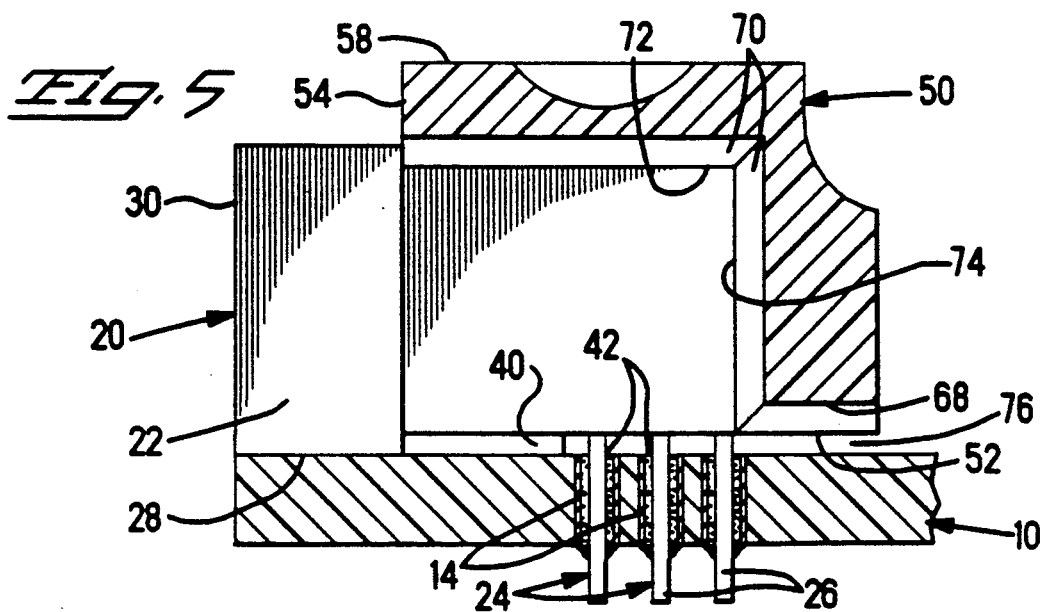

Circuit board 10 includes arrays 12 of through-holes 14 which constitute termini of respective circuit paths of the board, and electrical connectors 20 are associated with respective arrays 12. Each connector 20 includes a dielectric housing 22 and a plurality of contacts 24 having pin-shaped contact sections 26 (FIGS. 4 and 5) depending from mounting face 28 to be inserted into respective ones of through-holes 14 to be soldered therein to define electrical connections with respective circuits of the board. Connectors 20 are shown to be right angle connectors having mating faces 30 along which second contact sections of contacts 24 are at least exposed matable with corresponding contact sections of other connectors (not shown) parallel to the board surface. Each connector 20 includes a top surface 34, rearward surface 36 and end surfaces 38, and board-adjacent bottom surface or mounting face 28 has an incremental recessed region 40 (FIGS. 4 and 5) opposed from the respective through-hole array 12 permitting access to the solder joints 42 by cleaning fluid to remove excess flux following the vapor phase reflow or wave soldering operation.

Board stiffener 50 is an elongate rigid member which may be molded of high heat resistant resin such as preferably liquid crystal polymer (LCP) such as VECTRA A130 glass fiber reinforced polyester resin (trademark of Hoechst Celanese Corp., Chatham, N.J.), or polyether ether ketone resin (PEEK) such as VICTREX (trademark of ICI Americas, Wilmington, Del.). Board stiffener 50 includes a bottom surface 52, side surfaces 54, 56, board-remote top surface 58 and end surfaces 60 which are preferably rectilinear, with at least board-proximate portions of bottom surface 52 being planar. Connector-receiving recesses 62 are defined in board stiffener 50 within which are received respective connectors 20 when board stiffener 50 is placed thereover and mounted to board 10 such as by fasteners 64 extending through mounting holes 66 and into corresponding mounting holes 16 of board 10 located along the elongate length thereof and close to each side surface 38 of each connector 20. Channels 68 are defined across bottom surface 52 which permit cleaning fluid to flow for solder flux removal after vapor phase reflow or wave soldering operations; channels 70 are also preferably defined into top recess surface 72 and rear recess surface 74 for solvent flow during flux cleaning for access to flux deposits behind connectors 20.

Recesses 62 are preferably of a depth incrementally less than the height of the connector top surfaces 34 from the board surface, so that upon abutment of wall portions of the recesses 62 with connector top surfaces 34 an incremental space 76 (FIG. 5) is defined between the board stiffener bottom surface 52 and board 10 upon mounting. The width of each recess 62 between recess ends 78 may be incrementally just less than the length of a connector 20 between end surfaces 38 so that interference fits with connectors 20 are formed when board stiffener 50 is inserted over the connectors and mounted firmly to the board.

The board stiffener of the present invention is adapted to be associated with particular connectors and is most useful when the connectors are also fabricated to controlled shapes and dimensions; the board stiffener may then be also useful in reinforcing the mounting of the connectors to the board. Modifications to the board stiffener may be devised which are within the spirit of the invention and the scope of the claims.

What is claimed is:

1. An article for minimizing warping of large circuit boards to which are to be soldered electrical articles of selected shapes and dimensions and in an elongated array, comprising:

an integral elongate member having a bottom surface, side surfaces and a board-remote surface with said bottom surface including board-proximate surface portions disposed in a common plane, said bottom surface including article-receiving recesses having shapes and dimensions complementary to said electrical articles, said member including means for mounting to a circuit board at a plurality of locations therealong spaced closely to respective said article-receiving recesses, said member adapted to be mounted firmly onto said board by receiving said articles into said article-receiving recesses and with wall portions of said article-receiving recesses abutting at least board-remote surfaces of said electrical articles prior to soldering contact sections of said electrical articles to corresponding contact means of said board, at least said bottom surface of said member includes a plurality of channels therealong permitting flow of solvent during flux-cleaning procedures following soldering of said electrical articles to said board, surfaces of said article-receiving recesses include channels therealong permitting flow of solvent therealong between adjacent surfaces of said member and said electrical articles, and said member being formed of especially heat resistant material to retain the integrity of its shape and dimension at elevated temperatures sufficient to minimize warping of a circuit board to which it is mounted.

2. The article of claim 1 wherein said electrical articles are electrical connectors having mating faces exposed after being mounted to said board, and said article-receiving recesses of said member being each in communication with at least one of said side or board-remote surfaces to expose said mating faces to enable mating to corresponding mating faces of corresponding electrical connectors.

3. The articles of claim 1 wherein the depth of said article-receiving recesses is just less than the height of said electrical articles so that upon mounting to abut said board-remote surfaces of said electrical articles, an incremental space is defined between said bottom surface of said member and said board.

4. The articles of claim 1 wherein the length of said article-receiving recesses is no more than slightly greater than the length of said electrical articles, and said article-receiving recesses are located to correspond to the location of said arrays of contact means of said board.

5. The article of claim 4 wherein the length of said article-receiving recesses is incrementally less than the length of said electrical articles so that an interference fit is established upon mounting of said member to said board about said electrical articles.

* * * * *